United States Patent [19]

Dantsker

[11] Patent Number: 4,466,849
[45] Date of Patent: Aug. 21, 1984

[54] PROCESS FOR REMOVING ADHESIVE TAPE

[75] Inventor: Edward Dantsker, Hyattsville, Md.

[73] Assignee: ERS Engineering Corporation, Royal Oak, Mich.

[21] Appl. No.: 351,989

[22] Filed: Feb. 24, 1982

[51] Int. Cl.³ .......................................... B32B 31/00
[52] U.S. Cl. .................................... 156/248; 156/150; 156/289; 156/344; 156/358; 156/584; 204/15
[58] Field of Search ............... 156/344, 248, 249, 247, 156/235, 241, 150, 289, 584, 358, 362, 363, 268; 204/15

[56] References Cited

U.S. PATENT DOCUMENTS

| | | | |
|---|---|---|---|
| 3,888,745 | 6/1975 | Hojyo | 156/344 X |
| 3,951,727 | 4/1976 | Greenberg | 156/344 X |
| 4,040,891 | 8/1977 | Chang | 156/344 X |
| 4,075,051 | 2/1978 | Brzozowski | 156/247 |
| 4,183,751 | 1/1980 | Matsumoto et al. | 156/344 X |
| 4,338,152 | 7/1982 | Del Bianco et al. | 156/361 |

FOREIGN PATENT DOCUMENTS 747882  12/1966  Canada ............................... 156/584

Primary Examiner—William A. Powell
Assistant Examiner—Thomas Bokan
Attorney, Agent, or Firm—John R. Benefiel

[57] ABSTRACT

A process and apparatus is disclosed for removing adhesive tape such as is used in masking PC boards during plating operations, the apparatus including rollers carrying an adhesive band which is brought into pressure contact with the adhesive tape. The PC board is moved past the rollers to pick up the adhesive tape and strip it by wind-up on the roller periphery. Successive windings of the exposed adhesive undersurface of the tape act to enable successive removal cycles. The leading ends of the tape are easily strippable to facilitate removal, as by the use of a release agent, or by providing a localized area at the leading end of the tape which carries a mildly adherent adhesive.

11 Claims, 7 Drawing Figures

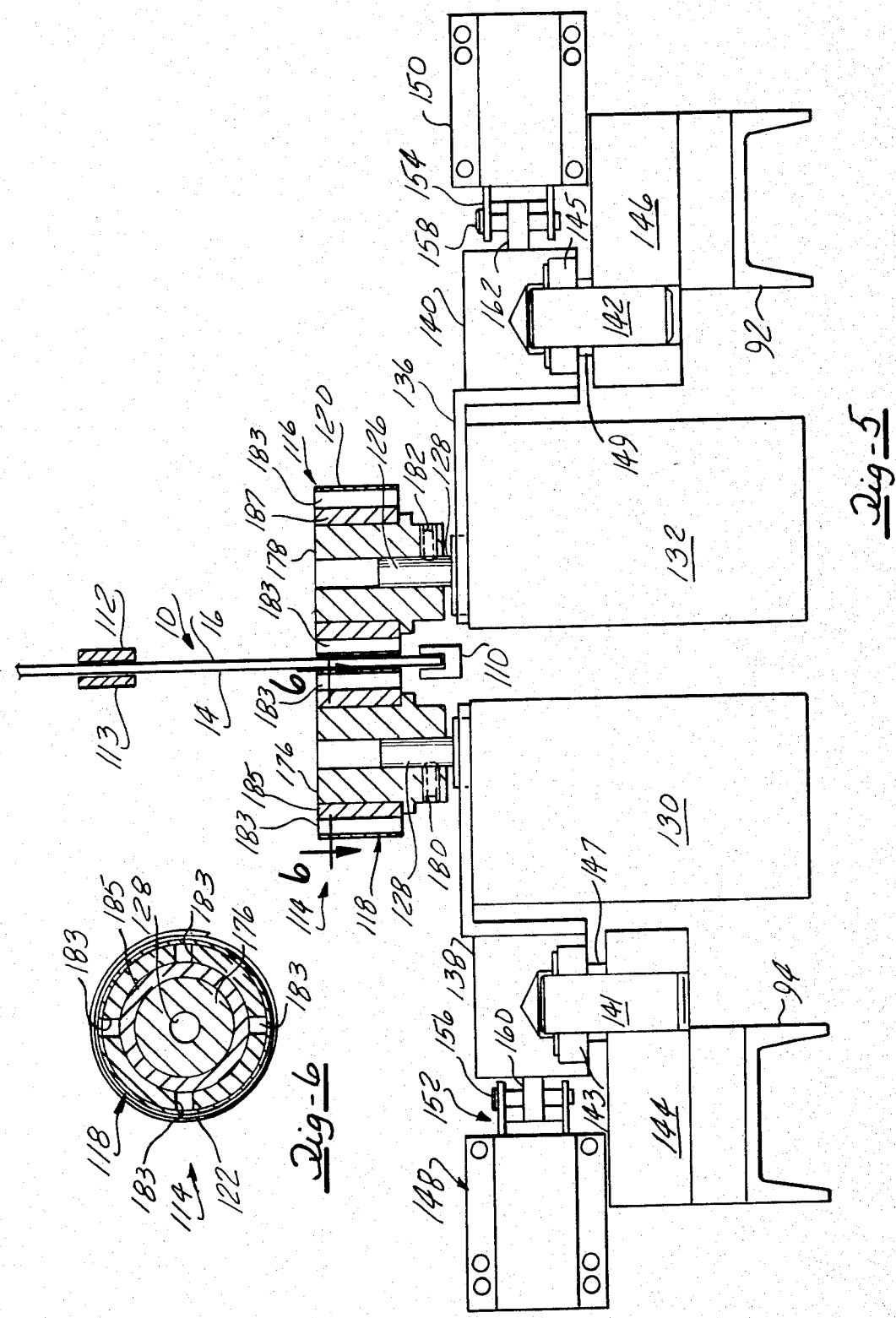

[4,466,849]

PROCESS FOR REMOVING ADHESIVE TAPE

BACKGROUND OF THE INVENTION

This invention concerns the application and removal of pressure adhesive sheet layers, such as masking tape used in the manufacture of printed circuit (PC) boards. The manufacture of PC boards currently involves the plating of contacts along one or both sides of the PC board. The contacts are most commonly plated with gold by an electrodeposition process, involving immersion of the side of the PC board in a gold salt bath. The extremely high cost of gold metal as well as a need for a clear border between gold fingers and the rest of the board has led to the use of lengths of masking tape applied to the side surfaces of the board to accurately limit the region immersed in the plating solution. Currently, a pressure adhesive masking tape is employed which is applied manually or by apparatus but which is manually removed after the plating process is complete. The tape must be tightly adherent in order to effectively mask the area of the PC board sought to be isolated from the plating solution, and thus the tape removal process has created a labor intensive step in the process of manufacture of the circuit boards.

Prior attempts have been made to mechanize or automate this process by mechanical stripping of the tape, essentially by vise gripping of the "tail" section and movement of the board by conveyor rollers. Such approach has not been able to be implemented with an acceptable level of reliability.

It is the object of the present invention to provide a process and apparatus which enables a great reduction in the labor involved in this aspect of the PC board manufacture, which process may also be employed in the application and removal of adhesive layers in other contexts.

It is a further object of the present invention to provide such a process and apparatus which reliably and efficiently enables completion of this phase in the manufacture of PC boards.

It is still a further object of the present invention to provide such process and apparatus which does not involve complex and costly equipment and materials to implement.

SUMMARY OF THE INVENTION

These and other objects of the present invention are achieved by a process and apparatus which includes rollers mounted for rotation about an axis parallel to the surface of the PC board, or other body bearing the adhesive tape. Each roller is initially provided with an adhesive outer layer or band carried about its periphery. The surface of the PC board is moved past the roller, with the adhesive layer in registry with the tape layer to be removed, and in pressure contact therewith so as to cause the tape outer surface to be adhered to the roller adhesive band and removed from the surface by winding on the roller periphery. The tape is caused to be mildly adherent at one end by treating a localized area of the surface of the body with a release agent, or alternatively, by using an adhesive tape including a localized area of mildly adherent adhesive.

This end of each length of tape is therefore relatively easily lifted from the surface and adhered to the roller adhesive band, and continued lift off of the tape for the remainder of its length is assured by the secure adhesion of this end of the tape to the roller periphery.

The PC board process described usually involves a masking of opposite sides thereof, and in this case the tape is wrapped about the leading edge and passed down both of the opposite sides. In this application, the leading edge is required to be notched as by a slitting or other operation either achieved manually or by an automatic device incorporated in the apparatus according to the present invention. A pair of opposing rollers are employed which receive the PC board therebetween during the removal operation to simultaneously remove tape from side surfaces of the PC boards. The PC board is advanced through the rollers by powered rotation of the rollers as the PC board is brought into pressure contact therewith, the PC board being guided therebetween in a guide channel.

The rollers are initially positioned in a spaced apart relationship and moved to engagement as the PC board approaches the rollers by the use of microswitch activated solenoids, the energization of which causes the rollers to be brought towards each other and into pressure contact with the leading area of the PC board.

In one embodiment each of the rollers is mounted for swinging or pivoting on a swing arm to enable the positioning thereof. In another embodiment, each roller is mounted for translational motion along oppositely directed slides.

The adhesive band on the rollers initially may be provided by a removable disposable ring being constructed of a lightweight material such as corrugated paperboard having a layer of double-backed adhesive tape applied thereto, which ring is removed and replaced upon an increase in the diameter of the roller with successive windings of the removed tape to a maximum diameter. Alternatively, the roller outer surface itself may have a layer of adhesive applied thereto and the accumulated windings of tape periodically removed as by a manual cutoff.

BRIEF DESCRIPTION OF THE DRAWINGS

FIG. 5 is a front elevational view of the apparatus shown in FIGS. 3 and 4.

FIG. 6 is an endwise view of one of the rollers incorporated in the apparatus according to the present invention with accumulated windings of removed tape.

DETAILED DESCRIPTION

In the following detailed description, certain specific terminology will be employed for the sake of clarity and a particular embodiment described in accordance with the requirements of 35 U.S.C. 112. It should be understood that this is not intended to be limiting and indeed should not be so construed inasmuch as the invention is capable of taking many forms and variations within the scope of the appended claims.

In particular, the process and apparatus as will be described herein is specifically directed to the removal of masking tape from printed circuit boards in which a length of tape is passed about one edge of the circuit board and extends along the opposite side surfaces thereof with a projecting short length of the PC board during electrodeposition plating of contact areas along the lower edge. Other applications of the process and apparatus are possible as for example the removal of a length of tape from a single surface of an item or body from which the tape is to be applied and subsequently stripped.

The process and apparatus does however have a particularly advantageous application to the process of plating the contacts on PC boards.

Figure 1:
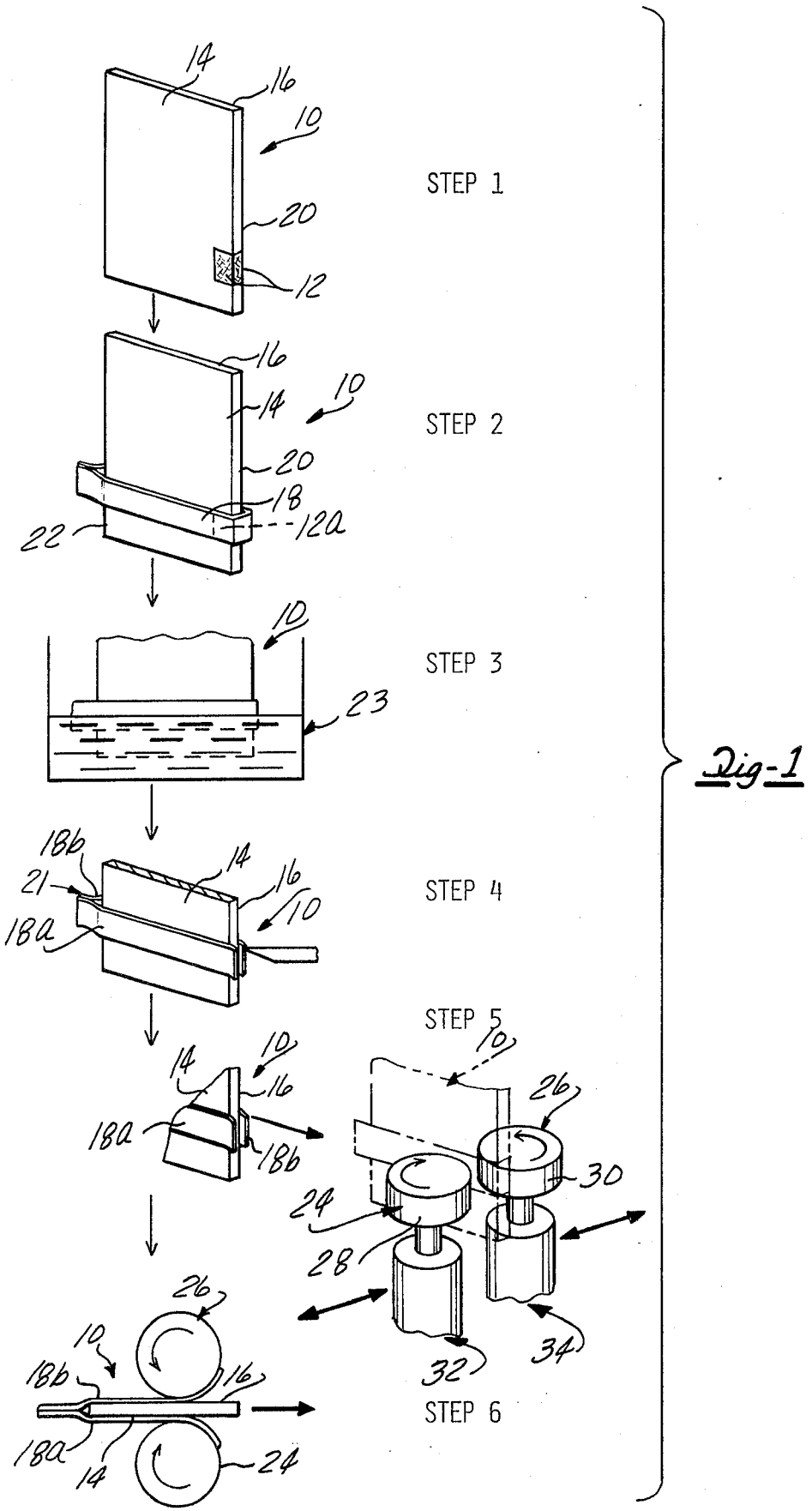
FIG. 1 is a diagrammatic flow chart illustrating the successive steps in the application and removal of tape according to the process of the present invention.

Referring to FIG. 1, the process as applied to the manufacture of a PC board is illustrated in a simplified diagrammatic form. The PC board 10 in step 1 is initially treated in localized areas 12 with a releasing agent such as is used in molding processes. Suitable such agents are commercially available, typically employing a "Teflon" (trademark) spray material. The localized areas 12 are located on either side 14 and 16 of the PC board 10 which are to be taped. In step 2, a length of tape 18 is then wrapped about the leading edge 20, defined as that edge to which the localized areas 12 are adjacent.

Alternatively, step 1 may be eliminated by the use of special lengths of tape which have areas of mildly adherent glue in the regions 12a corresponding to localized areas 12. The tape 18 is applied to extend along both sides 14 and 16 of the PC board 10. The ends of the tape length 18 are adhesively secured to each other to produce a tail portion 21 extending from the trailing edge 22 of the PC board 10.

In step 3, the plating operation is then conducted by immersion of the PC board 10 in a salt solution bath diagrammatically indicated at 23. This step of course does not form a part of the present invention and accordingly, a detailed description is not here included of the particulars of this process.

After completion of the plating process, the portion of the tape 18 overlying the leading edge 20 is slit (either manually or by automatic equipment) as indicated in step 4 of FIG. 1. The now free ends of the resulting two lengths of tape overlie the localized areas 12 or have regions 12a to be easily strippable.

In step 5, the PC board 10 is then appropriately positioned to be passed into pressure contact with a pair of rollers 24 and 26, each mounted for rotation about the axis parallel to the surfaces or sides 14 and 16 of PC board 10 which carried the lengths of adhesive tape 18a and 18b. Each of the rollers 24 and 26 carries a band 28 and 30 respectively of adhesive which comes into pressure contact with a respective length of adhesive tape 18a 18b. The adhesive bands 28 and 30 are thereby adhered to the adhesive tape to be removed by pressure contact, and, due to the reduced adhesion of the localized regions 12, these are easily lifted off by the roller rotation, and the relative movement of the PC board past and between the rollers 24 and 26.

As the PC board 10 is moved, the lengths of tape 18a and 18b are wound onto the periphery of the rollers 28 and 30 respectively so as to be removed from the PC board 10. In the preferred form of the invention each of the rollers 24 and 26 are powered to be rotated as by motors 32 and 34 so that the advancement of the PC board 10 through the rollers 24 and 26 is achieved by engagement of the periphery of the respective rollers 24 and 26 with the opposite sides 14 and 16 of the PC board 10, as indicated in step 6 in FIG. 1.

The rollers 24 and 26 are initially separated and upon approach of the circuit board 10, the roller motor assemblies are moved toward each other so as to engage the respective tape lengths as the circuit board moves into the space therebetween.

Figure 2:
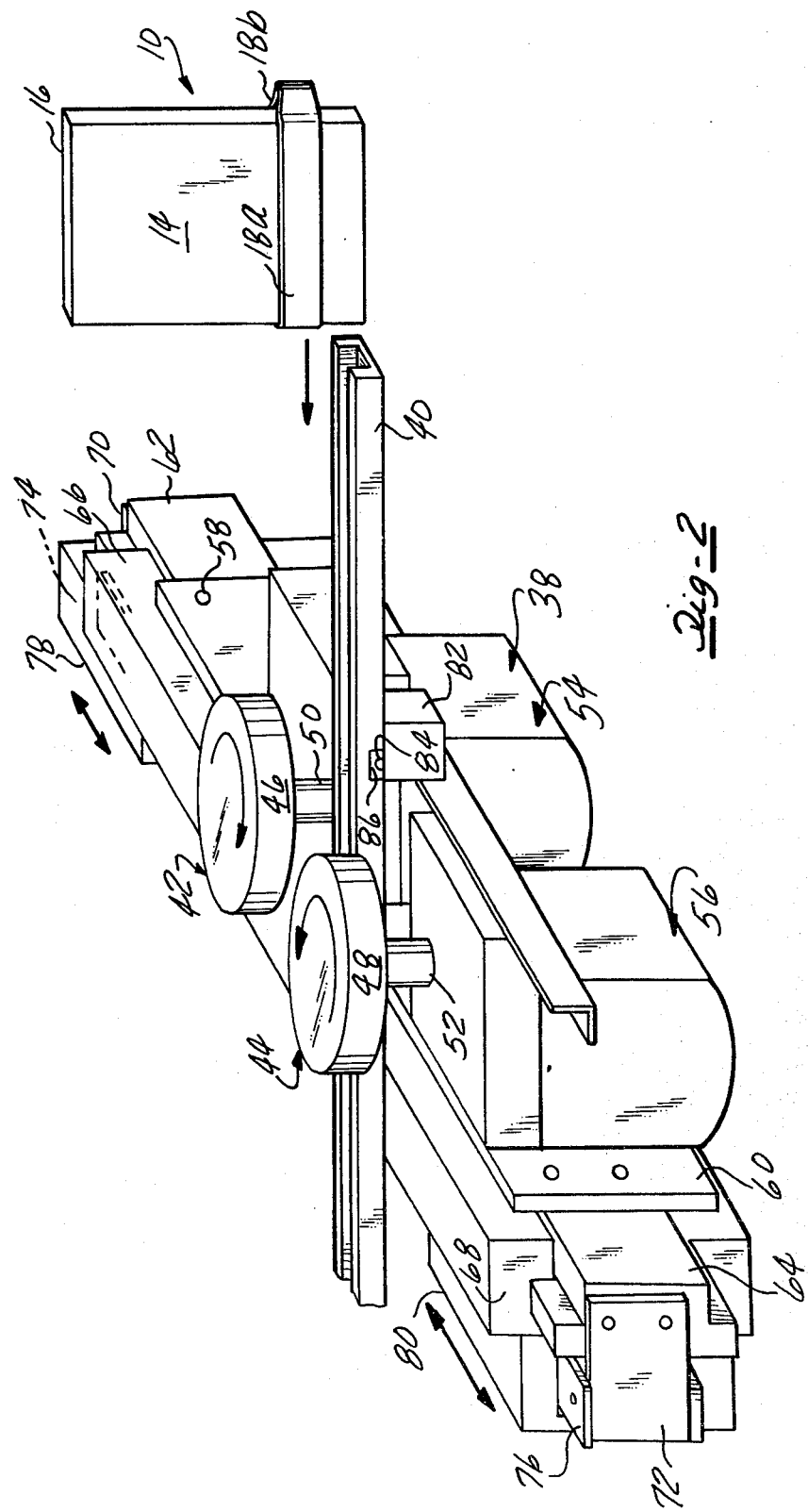
FIG. 2 is a perspective view of an apparatus according to the present invention.

Referring to FIG. 2, an apparatus for performing the removal steps of the process described in FIG. 1 is depicted. The apparatus 38 includes guide means comprised of a guide channel 40 for guiding the PC board 10 bearing the tape segments 18a and 18b towards the space between a pair of rollers 42 and 44, each mounted for rotation about an axis parallel to the surface of the sides 14 and 16 of the PC board 10 which bears the adhesive tape segments 18a and 18b. The guide channel 40 properly positions the PC board 10 at the appropriate height such that the periphery 46 and 48 of the rollers 42 and 44 respectively are aligned with the lengths of the tape 18a and 18b to be removed. The width of the rollers periphery 46 and 48 is sufficient to substantially completely overlie the width of the tape segments 18a and 18b allowing for some slight misalignments. In those instances in which a variety of tape widths are to be encountered, the roller peripheries 46 and 48 are selected to be slightly wider than the widest tape to be removed to also accommodate any slight misalignments. The peripheries 46 and 48 of the rollers 42 and 44 each carry an adhesive band, either consisting of a double-backed pressure sensitive adhesive tape or a replaceable ring as will be described hereinafter, in turn carrying the adhesive band.

Each of the rollers 42 and 44 are mounted on output shafts 50 and 52 of drive motors 54 and 56 mounted to rotate the respective rollers 42 and 44 in a direction tending to advance the PC board 10 therebetween as indicated in FIG. 2. The rollers 42 and 44 and their respective drive motors 54 and 56 are each mounted for translational movement directly towards and away from each other and transverse to the path of the PC board 10 as controlled by the guide channel 40. Each assembly is mounted to a respective mounting plate 58 and 60 which is in turn mounted to a respective Tee bar 62 and 64 received in ways 66 and 68. Each of the Tee bars 62 and 64 are drivingly connected to a respective solenoid actuator 78 and 80 by means of a connective tie plate 70 and 72 received between an actuating fork 74 or 76.

Electrical solenoids 78 and 80, upon energization thereof, cause the respective motors 54 and 56 and rollers 42 and 44 to be advanced toward each other to be caused to come into pressure contact with the side surfaces of the PC board 10 and the tape segments 18a and 18b. A microswitch 82 is mounted beneath a guide channel 40 having a detector finger 84 positioned within a cutout 86 such that the solenoids 78 and 80 are energized upon advance of a PC board 10 within the guide channel 40 into proximity with the rollers 42 and 44. The motors 54 and 56 are continuously energized to cause the rollers 42 and 44 to be rotating as they come into contact with the leading side or edge 20 of the PC board 10. Solenoids 78 and 80 are of standard commercially available configuration, which may include a spring return and an electrical actuation.

The adhesion of the adhesive bands 46 and 48 is sufficient to lift off the mildly adhered leading ends of the tape segments 18a and 18b and upon secure adhesion to the periphery thereof by the contact pressure, the resistance presented by the pressure sensitive adhesion of the remaining lengths of the tape segments 18a and 18b can be overcome and the tape stripped from the sides 14 and 16 respectively. Successive layers of the tape segments 18 are wrapped about the periphery atop the original adhesive bands by the tape segments removed from a previous PC board the exposed surface of which act as the adhesive band for a succeeding removal cycle. This causes a gradual increase in diameter of the rollers 42 and 44 by accumulation of the tape windings consisting of the removal lengths of tape 18a and 18b from successive PC boards 10.

It is noted that many of the extraneous details have been omitted from the apparatus shown in FIG. 2 in order to provide a clear understanding of the operation thereof, such as a cover etc., supporting members, control circuitry, switches etc.

Figure 3:
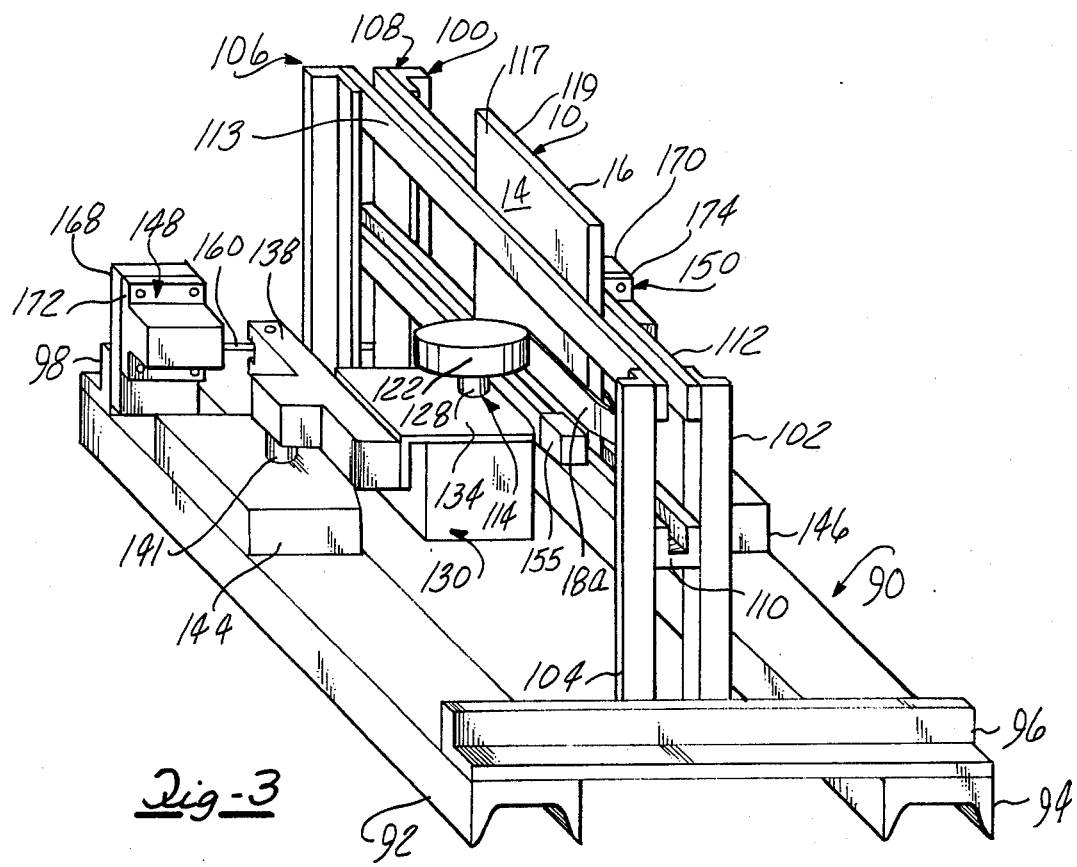
FIG. 3 is a perspective view of an apparatus according to a second embodiment of the present invention.

In FIG. 3, the preferred embodiment of the apparatus according to the present invention is shown in which an alternative arrangement for providing movement of the rollers and motors towards and away from each other in order to establish the positioning of the rollers from a separated position to a closed position producing a pressure contact with the PC boards. In this arrangement, the apparatus 90 includes support means, consisting of a pair of channels 92 and 94 joined with angles 96 and 98. Guide means 100 is also provided for the PC boards, consisting of a pair of angles 102, 104 at the leading end and angles 106 and 108 at the rear, with a channel bar 110 mounted intermediate the height of the angles 102, 108 of a width adapted to receive and guide the PC board 10. A pair of spaced side bars 112 and 113 are also provided at the upper ends of the angles 102, 108 to provide a stablized guiding of the PC board 10 as it is advanced through the machine.

It is noted that many extraneous details are omitted in these views for the sake of clarity, such as a suitable cover, etc. as well as the various switches which may be employed including microswitches for activating the controls for moving a pair of rollers 114 and 116. Each roller 114 and 116 is mounted for rotation about axis parallel to the side surfaces 117 and 119 bearing the tape segments 18a and 18b. In this embodiment each of the rollers 114 and 116 carries an outer band 118 and 120 consisting of pressure sensitive, double-backed tape adhesive applied thereto rollers 114 and 116 are fixed to output shafts 128 and 126 respectively of drive motors 130 and 132. The rollers 114 and 116 and respective motors 130 and 132 are mounted by means enabling swinging motion such as to be moved toward and away from each other to establish and disestablish pressure engagement with the side surfaces 14 and 16 of the PC board 10. This means includes a support bracket 134 and 136 respectively, pivot bars 138 and 140, each rotatably mounted by pivot pins 141 and 142 call out bearings respectively. Pivot pins 141 and 142 are received within support blocks 144 and 146 mounted on a respective channel 92 and 94. Bearings 143 and 145 carried by pivot bars 138 and 140 receive the respective pivot pins 141 and 142, with spacers 147 and 149 located atop blocks 144 and 146.

Pivot bars 138 and 140 in turn are positioned by means of electrical solenoids 148 and 150 respectively. Solenoids 148 and 150 have respective output yokes 152 and 154 respectively pinned with a cross pin 156, 158 to a respective one of swivel pins 160 or 162, each of which is mounted to one end of a pivot bar 138 or 140, so as to accommodate the swinging motions of the pivot bars during the extension of the actuator yokes 152 and 154. Solenoids 148 and 150 are spring returned and electrically extended, such that upon energization, the pivot bars 138 and 140 are rotated about the respective pins 140 and 142 to be moved, swung towards each other and the sides 14 and 16 of the PC board 10. Motors 130 and 132 are continuously energized upon start up of the machine, such that the rollers 114 and 116 are constantly rotating.

The actuation of the solenoids 148 and 150 is under the control of microswitches and control circuitry (not shown in FIG. 3).

Solenoids 148 and 150 are each mounted to the forward faces of the ends of the angle 98 by screws and fasteners 164 and 166 secured to flanges 172 and 174 and support blocks 168 and 170 each of those in turn being welded to the angle 98. In one embodiment of the invention, as shown in FIGS. 5 and 6 removable pulley hubs 176, 178 with slotted rings 185 and 187 affixed thereto are affixed by means of set screws 180 and 182 to the respective motor output shafts 128 and 126. A band of double-backed tape 118, 120 extending about each hub 176 and 178 is initially installed in order to establish the outer adhesive band about the periphery of the roller 114 and 116. Successive windings build up to a maximum diameter as shown in FIG. 6. Slots 183 enable the insertion of a cutting implement (not shown) to facilitate removal of accumulated windings, after which a fresh band of double-backed tape is applied.

Figure 7:
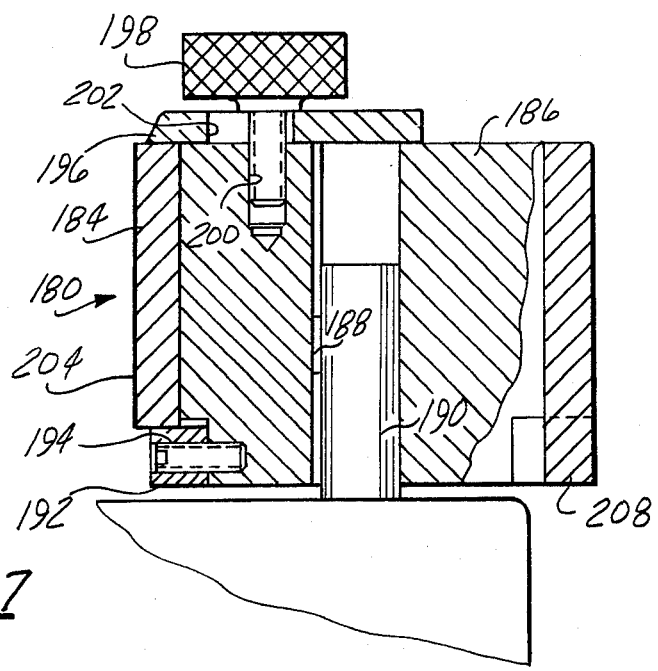
FIG. 7 is a sectional view of roller assembly according to an alternate embodiment.
Figure 4:
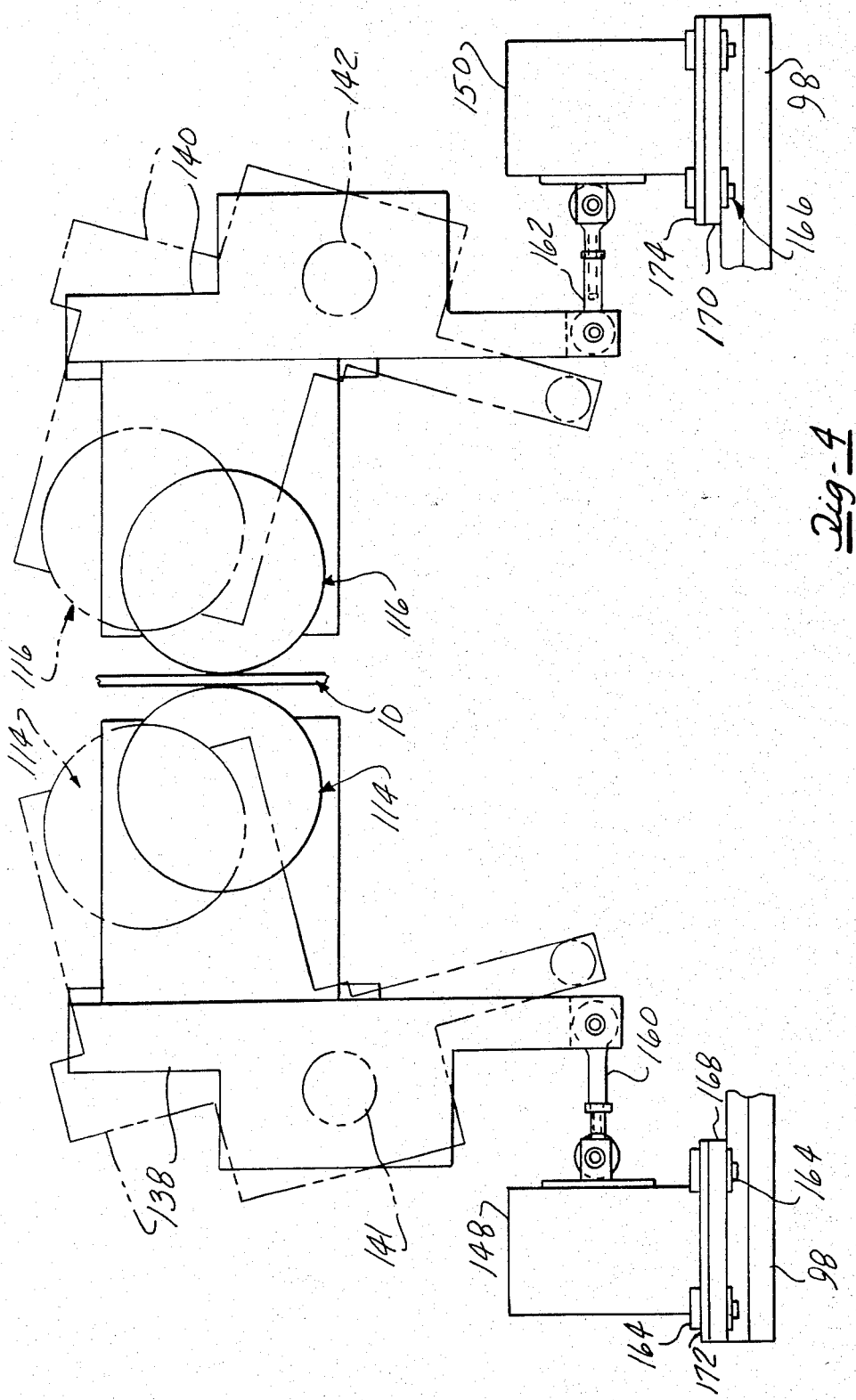
FIG. 4 is a simplified plan view of the apparatus shown in FIG. 3.

In FIG. 7 an alternative arrangement is shown, in which an outer paperboard ring 184 is carried on a hub 186 keyed at 188 to motor shaft 190. The hub 186 has a pair of 90° ring segments 192 affixed thereto at diametrically opposite locations by means of set screws 194, only one segment 192 is shown in FIG. 7. A retainer bar is secured by means of the hub 186, thumb screw 198 received in a threaded opening 200 extending axially into the end face of the hub 186. The retainer bar 196 is provided with an elongated slot 202 which allows adjustment of its radial position to enable convenient removal of the paper board ring 180 bearing a band of tape 204 on its outer surface. Axial projections 208 as formed on the ring 180 which interfit into the spaces between the ring segments 192. This portion is shown rotated 90° out of position to illustrate this feature to insure a positive driving connection to the ring 180. Alternate drive features may of course be employed.

Upon build-up of the diameters of the rollers with the successive windings of the removed lengths of tape, the ring 180 and accumulated windings may be removed and replaced with a replacement ring 180.

Accordingly, it may be appreciated that the above recited objects of the present invention have been achieved by the process and apparatus described.

I claim:

1. A process for removing lengths of pressure sensitive tape from opposite side surfaces of a body, wherein said tape lengths are joined by a joining portion extending about a leading surface of said body, comprising the steps of:
  establishing localized leading areas of said tape lengths to be mildly adherent to said body;
  severing said joining portion;
  passing said body between a pair of opposing rollers, each carrying an adhesive band about the periphery thereof with said lengths of tape in registry with said adhesive bands while urging said rollers into pressure contact therewith; and, rotating said rollers while in engagement with said surfaces to cause said body to be advanced between said rollers.

2. The process according to claim 1 wherein said step of establishing mildly adherent localized areas of said tape lengths to be mildly adherent to said body comprises the step of treating said body with a release agent at said areas.

3. The process according to claim 1 wherein said step of establishing mildly adherent localized areas of said tape lengths comprising the step of forming said tape with regions of mildly adherent adhesive.

4. The process according to claim 1 wherein said rollers are moved from a non-engaging position to a position in pressure contact with said body surfaces.

5. The process according to claim 4 wherein said rollers are pivoted to swing from a non-engaging position to a position in pressure contact with said body surfaces.

6. The process according to claim 5 wherein said body is moved to an approach position to approach said rollers, sensing said approach position and causing said rollers to move to pressure contact said body when said body has reached a position whereat the leading edge of said body is able to be contacted by pivoting movement of said rollers, to thereby bring the outer surfaces thereof into pressure contact with said body surfaces.

7. The process according to claim 4 wherein said rollers are translated from a relatively remote position from each other to more proximate position with respect to each other to establish said pressure contact with said body surfaces.

8. The process according to claim 1 wherein double-faced adhesive tape is applied to each of said rollers to cause each of said rollers to carry said adhesive band.

9. A process for applying and removing pressure adhesive masking tape from printed circuit boards from a leading edge and sides adjacent thereof, the process including the steps of:

applying a length of tape about said leading edge and along said sides;

establishing localized areas of mild adherence of said tape on either side of said printed circuit board adjacent said leading edge;

severing said tape at said leading edge;

introducing said leading edge of said board between a pair of opposed rollers each carrying a band of adhesive and passing said board therebetween while urging said adhesive bands into pressure contact with said severed tape lengths, whereby said tape lengths are removed by adherence to said adhesive bands and winding up on said rollers.

10. The process according to claim 9 further including the step of rotating each of said rollers to cause said board to be passed therebetween.

11. A process for applying and removing a length of adhesive tape from the surface of a body comprising the steps of:

applying a release compound to a region at one end of the area to which the tape is to be applied;

applying said length of tape to said area with one end thereof overlying said region;

bringing a roller carrying an adhesive outer band into pressure contact with said end of said tape overlying said regions; and, relatively moving said roller and said body so as to pass said roller along the length of said tape while maintaining said pressure contact, whereby removing said tape by adhesion and wind-up on said roller.

* * * * *